(12) United States Patent
Tran et al.

(10) Patent No.: US 6,232,221 B1
(45) Date of Patent: May 15, 2001

(54) BORDERLESS VIAS

(75) Inventors: Khanh Tran; Sunil Mehta, both of San Jose, CA (US); Andre Stolmeijer, Washougal, WA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/260,001

(22) Filed: Mar. 2, 1999

Related U.S. Application Data

(62) Division of application No. 08/992,431, filed on Dec. 18, 1997, now Pat. No. 5,925,932.

(51) Int. Cl.$^7$ ................................................ H01L 21/4763
(52) U.S. Cl. ..................... 438/637; 438/638; 438/639; 438/644; 438/645; 438/648; 438/654; 438/622; 438/788; 257/750; 257/758; 257/753; 257/752; 257/751
(58) Field of Search ..................... 438/637, 638, 438/639, 644, 645, 648, 654, 622, 788; 257/750, 758, 753, 752, 751

(56) References Cited

U.S. PATENT DOCUMENTS

| | | |
|---|---|---|
| 5,324,683 | 6/1994 | Fitch et al. . |
| 5,619,071 | 4/1997 | Myers et al. . |
| 5,619,072 | 4/1997 | Mehta . |
| 5,623,166 | 4/1997 | Olowolafe et al. . |
| 5,656,543 * | 8/1997 | Chung .................................. 438/625 |
| 5,702,981 * | 12/1997 | Maniar et al. ........................ 437/192 |
| 5,744,865 | 4/1998 | Jeng et al. . |
| 5,757,077 * | 5/1998 | Chung et al. ......................... 257/736 |
| 5,763,954 | 6/1998 | Hyakutake . |
| 5,808,364 | 9/1998 | Cronin et al. . |
| 5,828,132 | 9/1998 | Eissa . |

OTHER PUBLICATIONS

A.J. Konecni et al., "A Stable Plasma Treated CVD Titanium Nitride Film for Barrier/Glue Layer Applications", VMIC Conference, Jun. 18–20, 1996, 1996 ISMIC–106/96/0181(c), pp. 181–183.

Kim et al., "Stability of TiN Films Prepared by Chemical Vapor Deposition Using Tetrakis–dimethylamino Titanium", Electro chem. Soc., vol. 143, No. 9, Sep. 1996, pp. L188–L190.

Iacoponi et al., "Resistivity Enhancement of CVD TiN With In–Situ Nitrogen Plasma and Its Application in Low Resistance Multilevel Interconnects", Advanced Metalization and Interconnect Systems for ULSI, 1995, (5 pages).

Eizenberg et al., "Chemical vapor deposited TiCN: A new barrier metallization for submicron via and contact applications", J. Vac. Sci. Technol. A, vol. 13, No. 3, May/Jun. 1995, pp. 590–595.

Eizenberg et al., "TiCN: A new chemical vapor deposited contact barrier metallization for submicron devices", (3 pages).

(List continued on next page.)

*Primary Examiner*—Matthew Smith
*Assistant Examiner*—Belur Keshavan

(57) ABSTRACT

Borderless vias are formed by depositing a hard dielectric mask layer on the upper surface of a lower metal feature and forming sidewall spacers on the side surfaces of the metal feature and mask layer. A dielectric interlayer is deposited and a misaligned through-hole formed therein by etching. The dielectric material of the sidewall spacer and dielectric material of the dielectric interlayer are different. The etchant employed to form the through-hole exhibits a high selectivity with respect to the sidewall spacer material. The dielectric mask layer enables the formation of a sidewall spacer extending above the metal feature such that, after etching to form the misaligned through-hole, the sidewall spacer covers the side surface of the metal feature.

14 Claims, 5 Drawing Sheets

OTHER PUBLICATIONS

Hillman et al., "Comparison of Titanium Nitride Barrier Layers Produced by Inorganic and Organic CVD", Jun. 9–10, 1992, VMIC Conference, 1992, ISMIC–101/92/0246, pp. 246–252.

Liu et al., "Integrated HDP Technology for Sub–0.25 Micron Gap Fill", Jun. 10–12, 1997, VMIC Conference, 1997, ISMIC–107/97/0618(c), p. 618–619.

Bothra et al., "Integration of 0.25μm Three and Five Level Interconnect System for High Performance ASIC", Jun. 10–12, 1997, VMIC Conference, 1997, ISMIC–107/97/0043, pp. 43–48.

Wang et al., "Process Window Characterization of ULTIMA HDP–CVD™ USG Film", Feb. 10–11, 1997, DUMIC Conference 1997 ISMIC–222D/97/0405, pp. 405–408, 619.

Saikawa et al., "High Density Plasma CVD for 0.3μm Device Application", Jun. 18–20, 1996, VMIC Conference 1996 ISMIC–106/96/0069(c), pp. 69–75.

Nguyen et al., "Characterization of High Density Plasma Deposited Silicon Oxide Dielectric for 0.25 Micron ULSI", Jun. 27–29, 1995, VMIC Conference 1995 ISMIC–104/95/0069, pp. 69–74.

* cited by examiner

BORDERLESS VIAS

This application is a divisional of application Ser. No. 08/992,431 filed Dec. 18, 1997 now U.S. Pat. No. 5,925,932.

TECHNICAL FIELD

The present invention relates to a method of manufacturing a high density, multi-metal layer semiconductor device exhibiting a reliable interconnection pattern. The invention has particular applicability in manufacturing high density multi-metal layer semiconductor devices with design features of 0.25 micron and under.

BACKGROUND ART

The escalating requirements for high densification and performance associated with ultra large scale integration semiconductor devices require design features of 0.25 micron and under, such as 0.18 microns, increased transistor and circuit speeds, high reliability, and increased manufacturing throughput. The reduction of design features to 0.25 microns and under generates numerous problems challenging the capabilities of conventional interconnection technology, including conventional photolithographic, etching, and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer, such as spin-on-glass (SOG) or high density plasma (HDP) oxide, is then applied to the resulting conductive pattern to fill in the gaps and the surface is planarized, as by conventional etching or chemical-mechanical polishing (CMP) planarization techniques.

As feature sizes, e.g., metal lines and interwiring spacings, shrink to 0.25 micron and below, such as 0.18 micron, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

A conventional conductive via is illustrated in FIG. 1, wherein first metal feature 10 of a first patterned metal layer is formed on first dielectric layer 11 and exposed by through-hole 12 formed in second dielectric layer 13. First metal feature 10 is typically formed as a composite structure comprising a lower metal layer 10A, e.g., titanium (Ti) or tungsten (W), an intermediate or primary conductive layer 10B, e.g., aluminum (Al) or an Al alloy, and an anti-reflective coating (ARC) 10C, such as titanium nitride (TiN). In accordance with conventional practices, through-hole 12 is formed so that first metal feature 10 encloses the entire bottom opening, thereby serving as a landing pad for the metal plug filling through-hole 12 to form the conductive via. Thus, the entire bottom surface of conductive via 16 is in direct contact with first metal feature 10.

Conductive via 16 electrically connects first metal feature 10 and second metal feature 14 which is part of a second patterned metal layer. Second metal feature 14 is also typically formed as a composite structure comprising lower metal layer 14A, primary conductive layer 14B and ARC 14C. The plug filling the through-hole to form the conductive via is typically formed as a composite comprising a first adhesion promoting layer 15, which is typically a refractory material, such as TiN, Ti—W, or Ti—TiN, and a primary plug filling metal 17 such as W. Metal features 10 and 14 typically comprise metal lines with interwiring spacings therebetween conventionally filled with dielectric material 18, such as SOG or HDP oxide. The reduction in design features to the range of 0.25 micron and under requires extremely high densification which mandates high aspect ratio (height/diameter) openings. As the aspect ratio of openings increases, it becomes increasingly more difficult to deposit a barrier layer 15 (FIG. 1) by conventional sputtering techniques.

The conventional practice of forming a landing pad completely enclosing the bottom surface of a conductive via utilizes a significant amount of precious real estate on a semiconductor chip which is antithetic to the escalating high densification requirements. In addition, it is extremely difficult to voidlessly fill through-holes having such reduced dimensions because of the extremely high aspect ratio, e.g., in excess of 4. Accordingly, conventional remedial techniques comprise purposely widening the diameter of the through-hole to decrease the aspect ratio. As a result, misalignment occurs wherein the bottom surface of the conductive via is not completely enclosed by the underlying metal feature, but extends off of the metal feature onto surrounding dielectric material. This type of via is called a "borderless via", which also conserves chip real estate.

The use of borderless vias, however, creates new problems. For example, as a result of misalignment, the SOG gap filling layer is penetrated during etching to form a misaligned through-hole, due to the low density and poor stability of SOG. As a result of such penetration, moisture and gas accumulate, thereby increasing the resistance of the interconnection. Spiking can also occur, i.e., penetration of the metal plug to the substrate causing a short. Even without complete penetration, a side surface of the lower metal feature is exposed in forming a misaligned through-hole. Upon filling the misaligned through-hole with W employing vaporous tungsten hexafluoride ($WF_6$), an undesirable interaction with Al occurs.

For example, adverting to FIG. 2, first metal feature 22 is formed on substrate 21. Metal feature 22 is typically a composite comprising lower metal layer 22A, such as Ti or W, primary conductive layer 22B, e.g., Al or an Al-alloy, and ARC 22C, such as titanium nitride. Upon etching dielectric interlayer 23 to form misaligned through-hole 24, a side surface of lower metal feature 22 is exposed, as indicated by reference numeral 25. Upon subsequent deposition of W utilizing $WF_6$, an undesirable interaction occurs.

In U.S. Pat. No. 5,619,072, methodology is disclosed for preventing spiking, which methodology includes the formation of sidewall spacers on the side surfaces of the lower metal feature, which sidewall spacers serve as an etch stop layer when etching the misaligned through-hole. The dielectric interlayer comprises a material different from the sidewall spacer material, and an etchant is chosen which exhibits a greater selectivity with respect to the sidewall spacer material. However, etch selectivity is not infinite and, invariably, a portion of the upper surface of the sidewall spacer is removed, leaving exposed a portion of the primary conductive layer, i.e., Al or an Al-alloy.

For example, adverting to FIG. 3, metal feature 31, a composite comprising lower metal layer 31A, a primary conductive layer 31B containing Al or an Al-alloy, and ARC 32C, is formed on substrate 30. Sidewall spacers 33A and 33B are formed with the side surfaces of lower metal feature 31 extending to the upper surface thereof. Dielectric interlayer 34 is deposited and misaligned through-hole 35 formed therein. As etch selectivity is not infinite, an upper portion of sidewall spacer 33B (indicated by dotted line 36) is removed, leaving exposed a portion of primary conductive layer 31B which is typically undercut in the form of a concavity extending under but not including ARC 32C, as indicated by reference numeral 37. The difficulty of filling a borderless via having a high aspect ratio is exacerbated by the even higher aspect ratio of the portion of the borderless via adjacent the etched undercut portion 37 on the side surface of first metal feature 31. The difficulty in depositing a barrier material on undercut concave portion 37 becomes acutely problematic.

In depositing W from $WF_6$ vapor, it is recognized that an interaction with Al occurs. Accordingly, as depicted in FIG. 1, conventional practices comprise depositing a barrier layer 15, such as TiN, by sputtering. However, it is extremely difficult to sputter TiN in a through-hole having a high aspect ratio, let alone to coat a concave undercut portion on the side surface of a lower metal feature in the offset region. In copending application Ser. No. 08/924,131, filed Sep. 5, 1997 now U.S. Pat. No. 5,969,925, methodology is disclosed for depositing a conformal titanium nitride layer by chemical vapor deposition.

However, there exists a need for methodology enabling the formation of a highly reliable borderless via by forming a misaligned through-hole which does not expose a side surface of a lower metal feature, particularly the primary conductive portion containing Al or an Al-alloy, particularly for interconnection patterns having design features of 0.25 micron and under.

DISCLOSURE OF THE INVENTION

An object of the present invention is a high density multilevel semiconductor device with design features of 0.25 micron and under and a reliable interconnection structure comprising borderless vias.

Another object of the present invention is a method of manufacturing a high density multi-metal layer semiconductor device with design features of 0.25 micron and under and a reliable interconnection structure comprising borderless vias.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a first dielectric interlayer formed on a substrate; a first patterned metal layer, having gaps therein and a first metal feature, formed on the first dielectric interlayer, wherein the first metal feature has first and second side surfaces and an upper surface; a dielectric mask layer, having an upper surface and first and second side surfaces, formed on a first section of the upper surface of the first metal feature such that the second side surface thereof is substantially vertically aligned with the second side surface of the first metal feature, leaving a second section of the upper surface of the first metal feature exposed between the first side surface of the dielectric mask layer and the first side surface of the first metal feature; a first sidewall spacer, comprising a first dielectric material, formed on the first side surface of the first metal feature and having an upper portion extending substantially to the upper surface of the first metal feature; a second sidewall spacer formed on the second side surface of the first metal feature and on the second side surface of the dielectric mask layer and having an upper portion extending substantially to the upper surface of the dielectric mask layer; a second dielectric interlayer, comprising a second dielectric material different from the first dielectric material, formed on the dielectric mask layer and first and second sidewall spacers; a misaligned through-hole having an internal surface formed in the second dielectric interlayer exposing the first side surface of the dielectric mask layer and the upper portion of the first sidewall spacer, and leaving exposed the second portion of the first metal upper surface; and conductive material filling the through-hole to form a borderless via.

Another aspect of the present invention is a method of manufacturing a semiconductor device, which method comprises: forming a first dielectric interlayer on a substrate; forming a first patterned metal layer, having gaps therein and a first metal feature, on the first dielectric interlayer, wherein the first metal feature has first and second side surfaces and an upper surface; forming a dielectric mask layer on the upper surface of the first metal feature, therein the mask layer has first and second side surface substantially vertically aligned with the first and second side surfaces of the metal feature, respectively; forming first and second sidewall spacers, comprising a first dielectric material, the first sidewall spacer formed on the first side surface of the first metal feature and the dielectric mask layer, and the second sidewall spacer formed on the second side surface of the first metal feature, and the dielectric mask layer, each sidewall spacer having an upper portion extending substantially to the upper surface of the dielectric mask layer; forming a second dielectric interlayer, comprising a second dielectric material different from the first dielectric material, on the mask layer and on the upper portion of the first and second sidewall spacers; etching the second dielectric interlayer, using an etchant having a high etch selectivity with respect to the first dielectric material, to form a misaligned through-hole having an internal surface in the second dielectric interlayer and to remove part of the dielectric mask layer exposing a section of the upper surface of the first metal feature proximate the first side surface thereof, and removing a portion of the first sidewall spacer such that the first sidewall spacer extends substantially to the upper surface of the first metal feature; and filling the through-hole with conductive material to form a borderless via.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
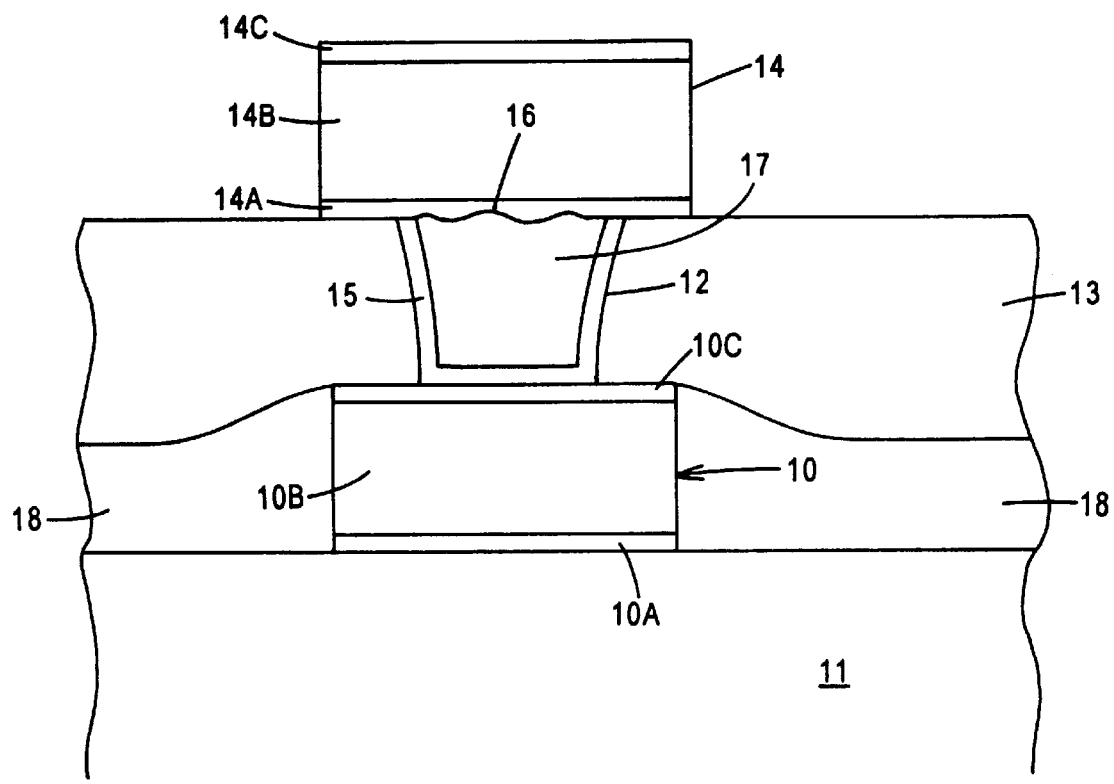
FIG. 1 schematically illustrates a conventional via structure.
Figure 2:
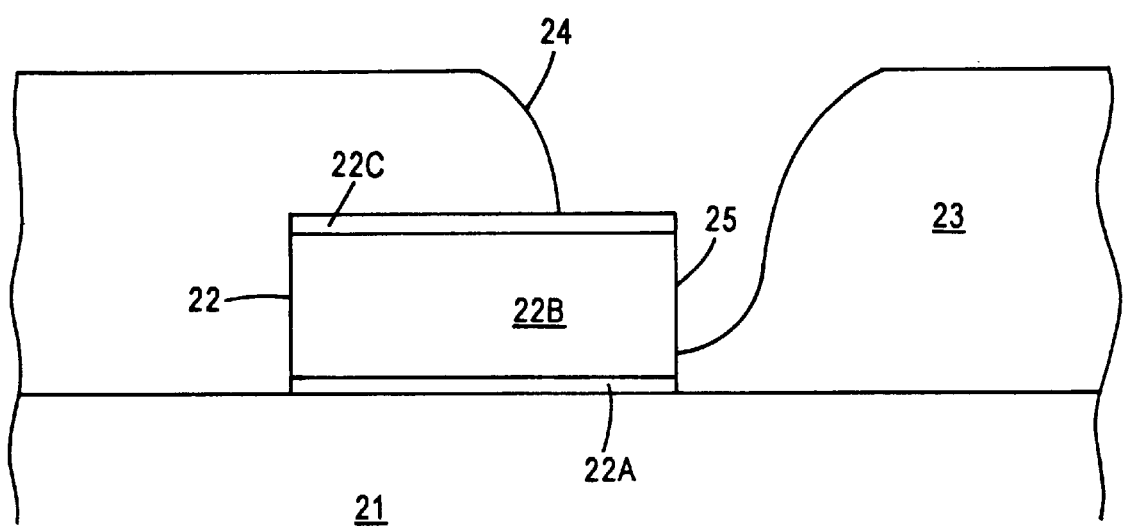
FIG. 2 schematically illustrates the side surface exposure problem in forming a borderless via.
Figure 3:
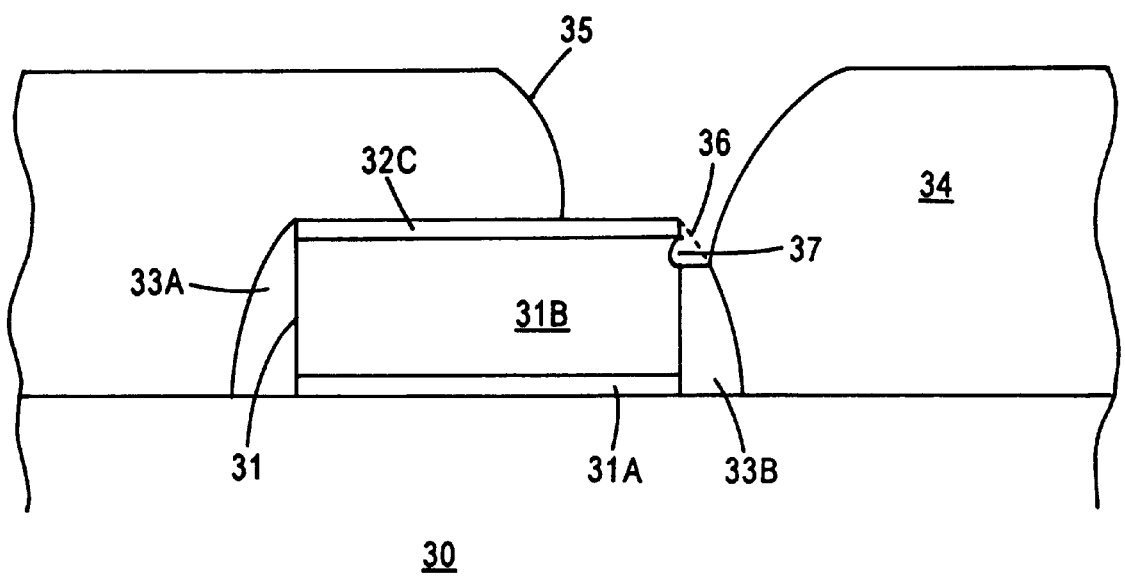
FIG. 3 schematically illustrates the side surface exposure problem of a borderless via employing etch stop sidewall spacers.

The present invention addresses and solves the side surface exposure problem, illustrated in FIG. 3, wherein a portion of a side surface of underlying metal feature 31 is etched during formation of misaligned through-hole 35 resulting in the exposure of a concave portion 37. In etching through-hole 35 through dielectric interlayer 34, an etchant is selected which exhibits a high selectivity with respect to sidewall spacer material 33B. However, as etching selectivity is not infinite, and as feature sizes shrink to 0.25 micron and under, a portion of the side surface of underlying metal feature 31 is exposed, forming concavity 37 which is very difficult to uniformly coat with a barrier material to prevent reaction with $WF_6$ during plug filling. If a barrier film is not formed directly on undercut portion 37, voids and etching residues would result, thereby increasing the resistance of the interconnection and adversely affecting device performance.

The present invention addresses and solves the side surface exposure problem by forming a dielectric mask layer on the upper surface of the metal feature having a selected thickness, and then forming dielectric sidewall spacers on the side surfaces of the underlying metal feature and dielectric mask layer. Thus, the height of the dielectric sidewall spacer is increased by the thickness of the dielectric mask layer to provide a safety margin compensating for the lack of infinite etch selectivity. Upon etching, due to the lack of infinite etch selectivity, a portion of the upper surface of the sidewall spacer in the region of the misaligned through-hole is removed. However, due to the additional height of the dielectric sidewall spacer substantially equal to the thickness of the dielectric mask layer, the side surface of the underlying metal feature, particularly below the ARC, is not exposed during etching of the misaligned through-hole.

Figure 4:
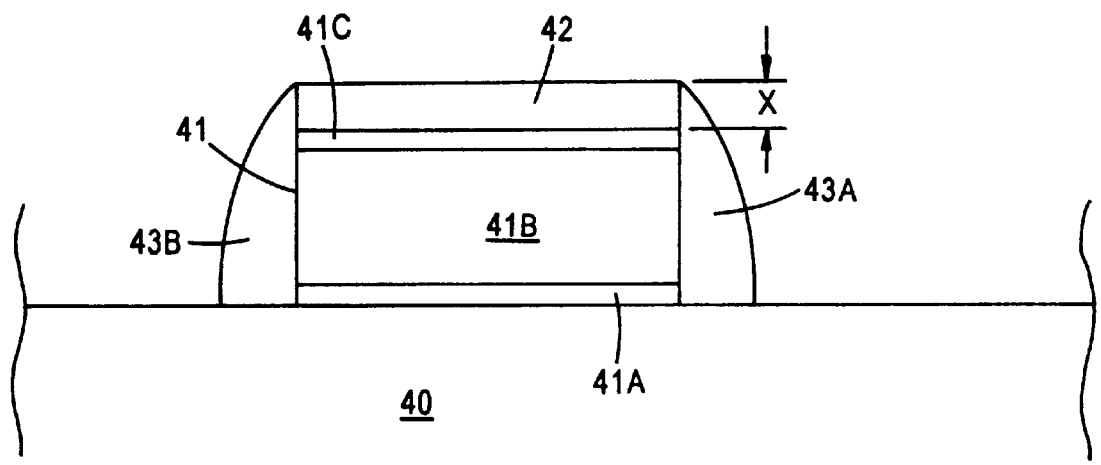
FIG. 4 schematically illustrates an embodiment of the present invention.
Figure 5:
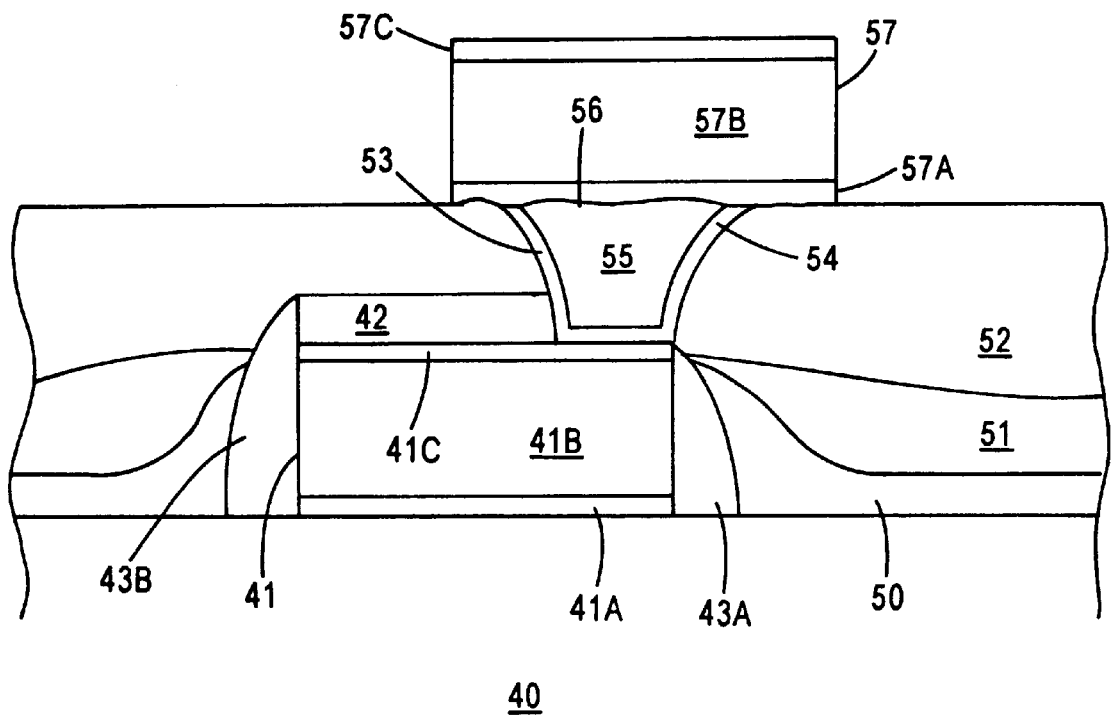
FIG. 5 illustrates another embodiment of the present invention.

Embodiments of the present invention are illustrated in FIGS. 4 and 5, wherein similar features bear similar reference numerals. Adverting to FIG. 4, metal feature 41, e.g., a metal line, which is part of a first patterned metal layer formed on substrate 40, comprises a first lower metal layer 41A, such as Ti or W, primary intermediate metal layer 41B, e.g., Al or an Al-alloy, and an upper ARC 41C, such as TiN. In accordance with the present invention, a hard dielectric mask layer 42 is formed on metal feature 41. Hard dielectric mask layer 42 comprises side surfaces which are substantially vertically aligned to the side surfaces of metal feature 41. Sidewall spacers 43A and 43B are then formed on the side surfaces of metal feature 41 and hard dielectric mask layer 42. By providing hard mask layer 42 in accordance with the present invention, the height of the sidewall spacer 43A is lengthened by the thickness X of hard dielectric mask layer 42 in order to compensate for the lack of infinite etch selectivity upon etching the non-aligned through-hole for a borderless via.

The hard dielectric mask 42 comprises a dielectric material which is typically similar to the dielectric material of a subsequently applied dielectric interlayer which, in turn, is different from the dielectric material of the sidewall spacer 43A. Typically, sidewall spacer 43A and sidewall spacer 43B are formed of the same dielectric material. The dielectric materials selected for the sidewall spacer 43A, hard dielectric mask 42, and subsequently applied interdielectric layer, are chosen to achieve a high etch selectivity with respect to sidewall spacer 43A upon etching a misaligned through-hole in order to maintain the height of sidewall spacer 43A at least above layer 41B of metal feature 41 to prevent exposure of the primary conductive layer typically comprising Al or an Al-alloy, thereby avoiding undesirable interaction with $WF_6$ during plug filling with an attendant improvement in interconnection reliability.

Adverting to FIG. 5, after formation of sidewall spacers 43A and 43B, a gap filling dielectric layer 50 is applied, such as hydrogen silsesquioxane (HSQ). In employing HSQ, the techniques disclosed in copending application Ser. Nos. 08/951,592, filed Oct. 16, 1997 now U.S. Pat. No. 5,866,945, 08/992,430, filed Dec. 18, 1997 now U.S. Pat. No. 5,942,801, 08/956,590, filed Oct. 23, 1997 now U.S. Pat. No. 5,888,911, and 08/956,588, filed Oct. 23, 1997 now U.S. Pat. No. 5,888,898, can be implemented for optimum HSQ performance. Subsequently, an oxide layer 51 is deposited on the gap filling layer 50 and planarized. Oxide layer 51 can comprise a silicon dioxide derived from TEOS by plasma enhanced chemical vapor deposition (PECVD) in an $O_2$-containing atmosphere, or silicon dioxide derived from silane by PECVD in an atmosphere containing $N_2H$.

After planarizing, as by chemical-mechanical polishing, a second dielectric interlayer 52 is deposited. Second dielectric interlayer 52 can comprise a silicon oxide, a silicon nitride or a silicon oxynitride, as can dielectric mask layer 42. Sidewall spacer 43A, as well as sidewall spacer 43B, can also comprise a silicon oxide, a silicon nitride or a silicon oxynitride; however, the dielectric material of second dielectric interlayer 52 in accordance with the present invention is different from the dielectric material of sidewall spacers 43A and 43B for high etch selectivity upon etching misaligned through-hole 53 in dielectric interlayer 52. The dielectric material of the hard dielectric mask layer 42 can be the same as the dielectric material of second dielectric interlayer 52.

A conductive material is formed in misaligned through-hole 53, typically comprising an initial barrier layer 54, such as TiN, and a second metal layer 55, e.g., W, deposited from $WF_6$. In accordance with the present invention, the TiN barrier layer 54, can be deposited by CVD as disclosed in copending application Ser. No. 08/924,131, filed Sep. 5, 1997. The entire disclosures of copending application Ser. Nos. 08/951,592, filed Oct. 16, 1997, 08/992,430, filed Dec. 18, 1997, 08/956,590, filed Oct. 23, 1997, 08/956,588, filed Oct. 23, 1997, and 08/924,131, filed Sep. 5, 1997 are incorporated herein by reference in their entirety. A second metal feature 57, which is part of a second patterned metal layer formed on second dielectric interlayer 52, is then formed in electrical contact with first metal feature 41 through borderless via 56. Second metal feature 57 can also comprise a lower metal layer 57A, such as Ti or W, a primary intermediate metal layer 57B, e.g., Al or an Al-alloy, and an upper ARC 57C, such as Ti—TiN.

Adverting to FIGS. 4 and 5, the thickness X of dielectric mask layer 42 effectively enables the extension of first sidewall spacer 43A by a distance substantially equal to X. Accordingly, as shown in FIG. 5, upon etching the misaligned through-hole, a portion of sidewall spacer 43A substantially equal to X is etched due to the lack of infinite etch selectivity; however, the portion of sidewall spacer 43A remaining after etching to form the misaligned through-hole protects the primary conductive layer 41B against interaction with the subsequently employed $WF_6$, thereby avoiding degradation of transistor performance. The effective shielding of the side surface of metal feature 41, particularly the primary conductive layer 41B containing Al or an Al-alloy, prevents formation of an undercut portion 37 (FIG. 3), thereby eliminating the generation of voids and etching residues which increase the resistance of the interconnection and adversely affect device performance.

Given the present disclosure and objectives of the present invention, one having ordinary skill in the art can easily optimize the thickness X of the dielectric mask layer in a particular situation, and select an appropriate etchant and appropriate dielectric materials for the second dielectric layer, sidewall spacers and dielectric mask layer. In etching the misaligned through-hole, the etchant is selected to achieve high selectivity with respect to the sidewall spacer. The dielectric material for the mask layer and dielectric material for the second dielectric interlayer can be the same. For example, upon employing silicon nitride for the sidewall spacers, silicon oxide for both the second dielectric interlayer and the dielectric hard mask layer, it was found that a hard dielectric mask layer having a thickness of about 500 Å to about 1,500 Å, e.g., 500 Å to 1,000 Å, effectively prevented exposure of the side surface of a metal feature containing an Al primary conductive layer with an ARC thereon.

Thus, in accordance with the present invention, a misaligned through-hole for a borderless via is formed without exposing the side surface of a metal feature, particularly the primary conductive layer containing Al or an Al-alloy, thereby avoiding undesirable interaction with subsequently employed $WF_6$ and consequential formation of an undercut portion leading to voids, an accumulation of residues and high resistance.

The present invention is applicable to the production of various types of semiconductor devices, particularly high density, multi-metal layer semiconductor devices, with submicron features of 0.25 micron and below, exhibiting high speed characteristics and improved interconnection reliability. The present invention is cost effective and can easily be integrated into conventional processing.

In carrying out the embodiments of the present invention, the metal layers, particularly the intermediate layer, can be formed of any metal typically employed in manufacturing semiconductor devices, such as Al, Al alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as W are deposited, CVD techniques are employed. Low melting point metals, such as Al and Al alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a first dielectric interlayer on a substrate;

forming a first patterned metal layer, having gaps therein and a first metal feature, on the first dielectric interlayer, wherein the first metal feature has first and second side surfaces and an upper surface;

forming a dielectric mask layer on the upper surface of the first metal feature, wherein the mask layer has first and second side surfaces substantially vertically aligned with the first and second side surfaces of the metal feature, respectively, and an upper surface;

forming first and second sidewall spacers, comprising a first dielectric material, the first sidewall spacer formed on the first side surface of the first metal feature and the dielectric mask layer, and the second sidewall spacer formed on the second side surface of the first metal feature and the dielectric mask layer, each sidewall spacer having an upper portion extending substantially to the upper surface of the dielectric mask layer;

forming a second dielectric interlayer, comprising a second dielectric material different from the first dielectric material, on the dielectric mask layer and on the upper portion of the first and second sidewall spacers;

etching the second dielectric interlayer, using an etchant having a high etch selectivity with respect to the first dielectric material, to form a misaligned through-hole having an internal surface in the second dielectric interlayer and to remove part of the dielectric mask layer exposing a section of the upper surface of the first metal feature proximate the first side surface thereof, and removing an upper portion of the first sidewall spacer such that the first sidewall spacer extends substantially to the upper surface of the first metal feature; and filling the through-hole with conductive material to form a borderless via.

2. The method according to claim 1, wherein the dielectric mask layer comprises the second dielectric material.

3. The method according to claim 1, wherein each of the first and second dielectric materials comprises a silicon oxide, a silicon nitride, or a silicon oxynitride.

4. The method according to claim 1, wherein the dielectric mask layer has a thickness of about 500 Å to about 1,500 Å.

5. The method according to claim 4, wherein the dielectric mask layer has a thickness of about 500 Å to about 1,000 Å.

6. The method according to claim 1, wherein the metal layer is a composite comprising a layer of aluminum or an aluminum alloy and an anti-reflective coating thereon.

7. The method according to claim 6, wherein the anti-reflective coating comprises titanium—titanium nitride.

8. The method according to claim 6, wherein the metal composite further comprises a bottom layer of titanium or tungsten.

9. The method according to claim 1, wherein the conductive material filling the through-hole comprises a barrier layer on the internal surface of the through-hole and a metal plug layer on the barrier layer.

10. The method according to claim 9, wherein the barrier layer comprises titanium nitride and the plug comprises tungsten.

11. The method according to claim 1, further comprising depositing a layer of silicon oxide to fill the gaps in the first patterned metal layer.

12. The method according to claim 11, wherein the silicon oxide comprises hydrogen silsesquioxane and is deposited by spin coating.

13. The method according to claim 11, further comprising:

depositing an oxide layer on the silicon oxide layer;

planarizing the oxide layer; and depositing the second dielectric interlayer on the planarized surface.

14. The method according to claim 13, further comprising forming a second patterned metal layer on the second dielectric interlayer, which second patterned metal layer comprises a second metal feature electrically connected to the first metal feature through the borderless via.

* * * * *